(12) United States Patent
Wolter et al.

(10) Patent No.: US 10,374,117 B2
(45) Date of Patent: Aug. 6, 2019

(54) SINGLE AND MULTI-AXIAL ARTICULATED BALLASTED PHOTOVOLTAIC MOUNT

(71) Applicants: James Wolter, Spring Lake, MI (US); Jeffrey Mathie, Albion, MI (US)

(72) Inventors: James Wolter, Spring Lake, MI (US); Jeffrey Mathie, Albion, MI (US)

(*) Notice: Subject to any disclaimer, the term of this patent is extended or adjusted under 35 U.S.C. 154(b) by 1225 days.

(21) Appl. No.: 13/975,982

(22) Filed: Aug. 26, 2013

(65) Prior Publication Data

US 2014/0069483 A1   Mar. 13, 2014

Related U.S. Application Data

(60) Provisional application No. 61/698,649, filed on Sep. 9, 2012.

(51) Int. Cl.
| | |
|---|---|
| *F24S 25/12* | (2018.01) |
| *H01L 31/18* | (2006.01) |
| *H02S 20/30* | (2014.01) |
| *H02S 20/10* | (2014.01) |
| *F24S 25/617* | (2018.01) |
| *F24S 25/70* | (2018.01) |
| *F24S 25/00* | (2018.01) |

(52) U.S. Cl.
CPC .............. *H01L 31/18* (2013.01); *F24S 25/12* (2018.05); *F24S 25/617* (2018.05); *F24S 25/70* (2018.05); *H02S 20/10* (2014.12); *H02S 20/30* (2014.12); *F24S 2025/019* (2018.05); *F24S 2025/02* (2018.05); *Y02E 10/47* (2013.01); *Y10T 29/49355* (2015.01)

(58) Field of Classification Search
None
See application file for complete search history.

(56) References Cited

U.S. PATENT DOCUMENTS

| | | | |
|---|---|---|---|
| 5,157,882 A | * | 10/1992 | Soble ...................... E04H 6/025 403/116 |
| 5,760,751 A | | 6/1998 | Gipson |
| 5,979,844 A | | 11/1999 | Hopkins |

(Continued)

OTHER PUBLICATIONS

Oxford English Dictionary "over, adj. (and n.2)." OED Online, Oxford University Press, Jun. 2018, www.oed.com/view/Entry/134245. Accessed Aug. 13, 2018 (Year: 2018).*

*Primary Examiner* — Magali P Slawski
(74) *Attorney, Agent, or Firm* — James E. Shultz, Jr.

(57) ABSTRACT

A solar panel mount system includes a ballasted block support resting on a ground surface, a post pivoted to the block support at a lower pivot, and a solar panel frame pivoted to the post at an upper pivot with a center of gravity over the ballasted block support and facing a desired sunlight-receiving direction. The upper pivot is selected to be at a desired adjusted height. The frame includes a yoke supported at the upper pivot and support beams supporting a solar panel. A method of installation includes placing the ballasted block support on the ground, and attaching the remaining components at desired angles to locate a center of gravity of the solar panel frame over the ballasted block support, and fixing an angle of the solar panel frame at a desired sun-facing position. A related method includes interconnecting solar panel frames on posts in a generally straight row.

17 Claims, 8 Drawing Sheets

(56) References Cited

U.S. PATENT DOCUMENTS

| | | |
|---|---|---|
| 6,682,029 B1 | 1/2004 | Dierkes |
| 6,734,830 B1 | 5/2004 | Bickham |
| 6,798,387 B2 | 9/2004 | Cockell et al. |
| 7,921,843 B1 | 4/2011 | Rawlings |
| 8,188,414 B2 | 5/2012 | Linke |
| 8,276,330 B2 | 10/2012 | Harberts et al. |
| 8,319,697 B2 | 11/2012 | Conrad |
| 8,413,391 B2 | 4/2013 | Seery et al. |
| 2009/0188487 A1 | 7/2009 | Jones et al. |
| 2010/0139645 A1* | 6/2010 | Whipple .................. F24J 2/542 126/576 |
| 2011/0024582 A1* | 2/2011 | Gies ........................ H02S 20/30 248/122.1 |
| 2011/0073104 A1* | 3/2011 | Dopp ....................... F24J 2/055 126/651 |
| 2011/0233157 A1* | 9/2011 | Kmita ..................... H02S 20/24 211/41.1 |
| 2011/0240006 A1 | 10/2011 | Linke et al. |
| 2011/0247675 A1 | 10/2011 | LeMay |
| 2012/0006317 A1 | 1/2012 | Sade |
| 2012/0036799 A1 | 2/2012 | Kneip et al. |
| 2012/0048351 A1 | 3/2012 | Rizzo |
| 2012/0175322 A1* | 7/2012 | Park ....................... F16B 5/0635 211/41.1 |
| 2012/0223032 A1 | 9/2012 | Rothschild et al. |
| 2012/0228442 A1 | 9/2012 | Clifton |
| 2012/0318323 A1 | 12/2012 | Tomaso |

\* cited by examiner

SINGLE AND MULTI-AXIAL ARTICULATED BALLASTED PHOTOVOLTAIC MOUNT

This application claims benefit under 35 USC section 119(e) of a provisional application Ser. No. 61/698,649, filed Sep. 9, 2012, entitled SINGLE AND MULTI-AXIAL ARTICULATION IN BALLASTED PHOTOVOLTAIC MOUNTING SYSTEMS, the entire contents of which are incorporated herein by reference.

BACKGROUND

The present invention relates to ballasted mounting apparatus and systems for supporting a photovoltaic (solar panel) array at an optimal position to harvest solar energy from incident solar radiation, and more particularly relates to a ballasted mounting apparatus having advantages of mechanically simple components that are few in number and intuitive to assemble, low in cost to install, and low in cost of materials, yet are robust, highly adjustable, sufficiently rugged for use in difficult environments, and very flexible and well adapted for use in different environments with minimal site preparation.

Solar systems are often installed on uneven or unfriendly terrain where leveling the ground surface may be prevented by environmental constraints (e.g. a capped landfill or a contaminated EPA-remediation site), rapidly varying gradients, rocky subsurface conditions, seasonally unstable terrain (e.g. permafrost or sand/peat bogs), or require excessive costs of moving earth. Conventional panel mounting systems (those having no mechanism for tilting and locking a supported solar array) have gained acceptance in solar contracting where site preparation can level the terrain. However, known conventional solar mounting systems do not accommodate irregularities in the terrain very well, such that site preparation must level the site. It is problematic that known conventional solar mounting systems do not, within themselves, include an ability to adjustably level solar panels to an overall system level and panel angle. It is problematic that most known conventional solar mounting systems require penetration of the earth and/or a foundation for anchoring the system.

Further, known conventional solar mounting systems require considerable installation time, effort, and cost at the installation site. This is at least partially because they generally lack portability, and lack an ability to substantially preassemble units at a staging site and move the preassembled units to an installation site. It is also related to a complexity and need for customization of components and lack of adaptability/flexibility in the known conventional mounting systems. Notably, known conventional solar mounting systems tend to be massive, expensive, and capital intensive, with materials and installation costs for the mounting system often adding up to a substantial percentage of the overall solar system expense.

SUMMARY OF THE PRESENT INVENTION

In one aspect of the present invention, a solar panel mount system includes a ballasted block support, a post pivoted to the blocks support at a lower pivot, and a solar panel frame pivoted to the post at an upper pivot with the solar panel frame having a center of gravity generally over a center of the ballasted block support and with a solar panel supported on the frame facing toward a desired sunlight-receiving direction.

In another aspect of the present invention, a solar panel mount system for attachment above a support includes a post defining a lower pivot for pivoted attachment to the support, and a solar panel frame pivoted to the post at an upper pivot with the solar panel frame having a center of gravity that is generally over a center of the lower pivot and with a solar panel supported on the frame facing toward a desired sunlight-receiving direction.

In another aspect of the present invention, a solar panel mount system includes a support, a post including a lower pivot and a series of holes around the lower pivot for fixing a selected angle of the post on the support, and further including a series of longitudinally-spaced holes that can be selectively engaged by a pivot pin to define an upper pivot. The system further including a yoke having a center section configured to engage the pivot pin at the selected hole and with ends configured to engage and support interconnected beams that define a frame for supporting at least one solar panel.

In still another aspect of the present invention, a method includes providing a post defining upper and lower pivots, providing a solar panel frame with yoke adapted to be pivoted to the upper pivot of the post, forming a ballasted block support, the step of forming being done either at an installation site or first formed then shipped to the installation site, attaching the post to the ballasted block support at the lower pivot, including pivotally attaching the post to the ballasted block support, angling the post to a desired vertical position, fixing the selected vertical position, and attaching the solar panel frame at the upper pivot, including pivotally attaching the solar panel frame to the post, angling the solar panel frame to a desired sun-facing position then fixing the selected sun-facing position.

In another aspect of the present invention, an apparatus includes a ballasted support, a frame supporting a photovoltaic panel, and an articulating support supporting the frame and the photovoltaic panel, the articulating support including a first adjustment for locating a center of gravity of the frame and the photovoltaic panel centered over the ballasted support, and a second adjustment for angling the photovoltaic panel at an optimal sunlight-receiving direction.

In another aspect of the present invention, an apparatus includes a ballasted support with a bottom surface defining a significant footprint and that does not penetrate a ground surface, a frame supporting a solar panel, and an articulating support supporting the frame and the solar panel over the ballasted support for rotational movement about different axes and in multiple different planar orientations.

An object of the present innovative system is to provide self-ballasted mounting systems with mounting footprints allowing it to replace the need for penetrative solar mounting systems (e.g. driven vertical-support posts or lag screws or auger supports engaging soil).

An object of the present innovative system is to provide hardware that allows for angular adjustment of generally vertical mounting posts that support a solar-collector array, but that do so without earth-penetrating mounting posts or poured concrete foundations.

An object of the present innovative system is to provide an ability to meet local codes and generally accepted engineering standards for wind-loading and/or seismic requirements for a completed installed system.

An object of the present innovative system is to provide a solar mounting system useful in installations on EPA-remediation sites where penetration below a capped fill is not allowed, or on a membrane-covered landfill site where penetration is not an option.

An object of the present innovative system is to provide a system that takes advantage of financial and tax incentives due to the non-permanent nature of the present ballasted solar mount system. It is noted that ballasted and non-permanent installations can be considered accessory equipment and thus not taxed as an "installation/capital asset" tax basis. Thus, permits from local governments can be obtained by legally describing the installation as "temporary" (as opposed to "permanent"). Thus, a permit to cover the landscape with a ballasted solar system can be permitted as a temporary structure, providing significant tax incentives and tax advantages. Alternatively, a permit may not even be required to meet land-use codes.

An object of the present innovative system is to provide a mounting system capable of use in substantially any earthly location (latitude and longitude) and most soil conditions (e.g. rock, lava, sand, sub-polar tundra, polar ice).

An object of the present innovative system is to provide a portable or semi-portable system that can be readily moved (or moved after subassembly) and related, thus enabling powering of seasonal or temporary expeditions, geological exploration for mining, oil, and/or gas, or military requirement. It is contemplated that the present innovative mount system can be used to bring electric power to storm ravaged recovery zones, refugee camps, and other disaster or war-torn geographies.

An object of the present innovative system is to provide a mount system that itself is capable of supporting a solar panel array(s) in a most stable gravitational position (with center of gravity over a best location), yet adjustably support the solar panel array(s) in an optimal angular position for receiving sunlight, and that is also adjustable to support the solar panel array(s) of the system in a relatively coplanar condition despite undulations and disruptions in the underlying ground surface.

An object of the present innovative system is to provide a ballasted support system for supporting a solar panel system above shallow waters, in seasonal flood planes, in holding basins, and/or over water/sewer treatment basins, thereby making use of acreage that is otherwise limited to a single use (or no use at all).

These and other aspects, objects, and features of the present invention will be understood and appreciated by those skilled in the art upon studying the following specification, claims, and appended drawings.

DETAILED DESCRIPTION OF PREFERRED EMBODIMENTS

The phrase "solar panel" as used herein is intended to refer to elements of photovoltaic systems and solar thermal systems and/or combination hybrid systems using one or both, which systems are used to harvest solar energy from incident solar radiation, and in particular is intended to refer to solar electric arrays forming part of an electrical energy system and to refer to solar thermal (heat transferring) arrays forming part of a heat-based energy system and to refer to integrated PV plus solar thermal panels which capture both electric and heat energy from the sun's radiation.

Figure 1:
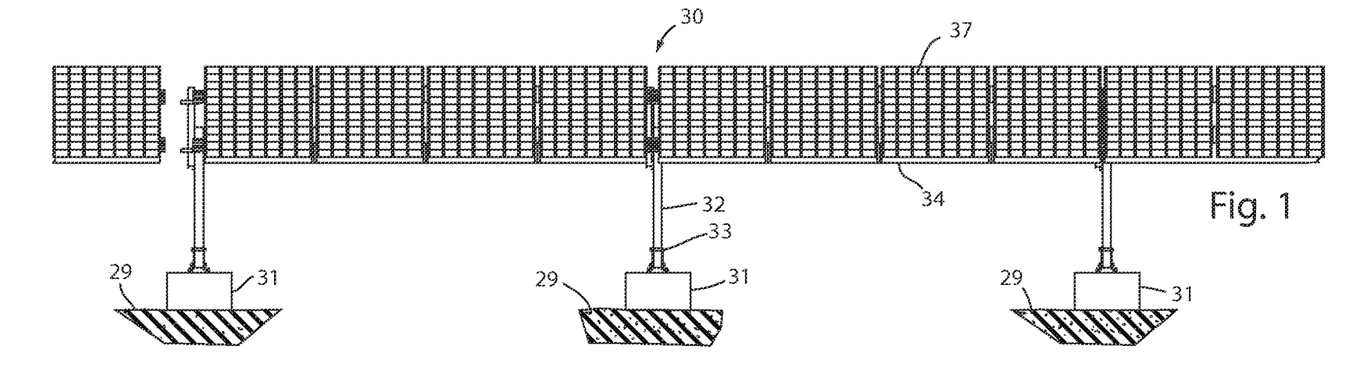
FIG. 1 is a front elevation fragmentary view, partially exploded, of an apparatus embodying the present invention, including ballasted block supports, articulated posts, panel frame, and photovoltaic (solar) panels, with two illustrated adjacent solar panels having abutting edges supported by a single yoke and post, and with each solar panel supported at each end with a yoke and post, the illustrated two solar panels and one exploded-away panel being part of a long string of aligned panels in a field of panels forming part of a solar panel powered system.
Figure 2:
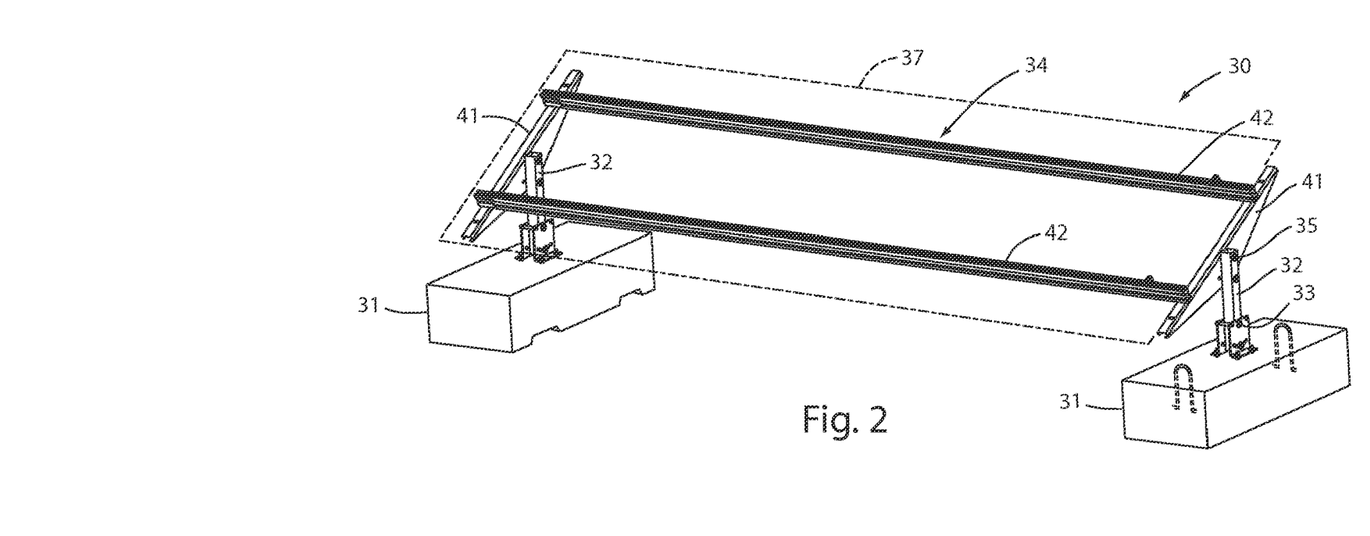
FIG. 2 is a perspective view of a single one of the panel sections of the apparatus in FIG. 1, the photovoltaic panels being transparent to show underlying components including a post at each end and the frame including yokes and yoke-to-yoke beams.
Figure 18:
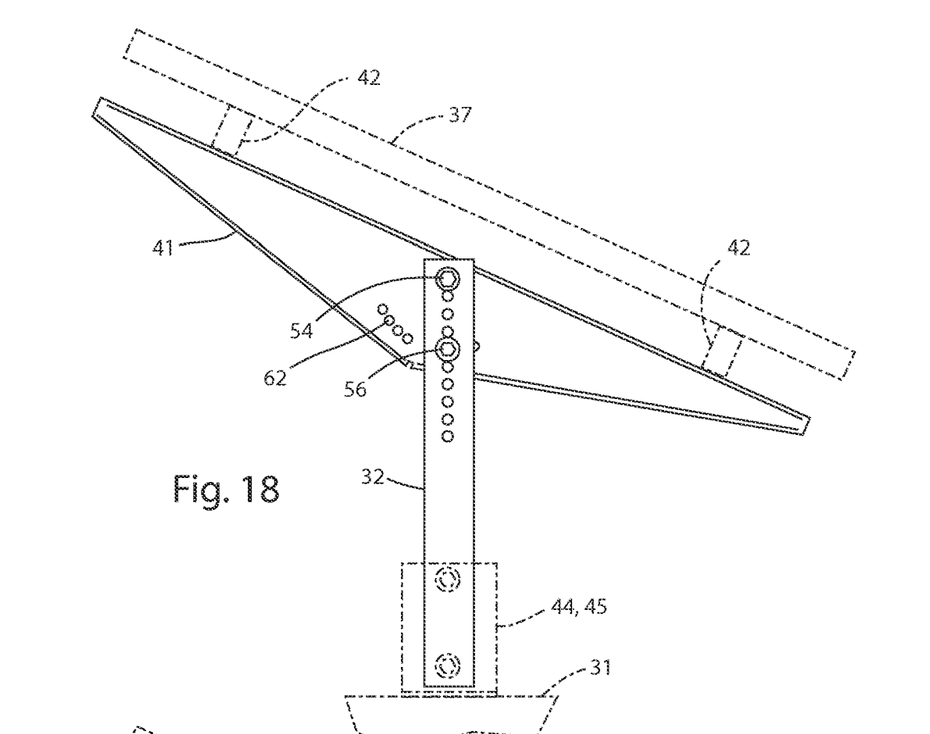
FIGS. 18-19 are side views of a cross member yoke attached atop a post, FIG. 18 showing the yoke in a high-mounted position on the post and FIG. 19 showing the yoke in a low-mounted position, which adjustment allows solar panels to be coplanar and aligned even when their ballasted support blocks are not coplanar and aligned in height.
Figure 19:
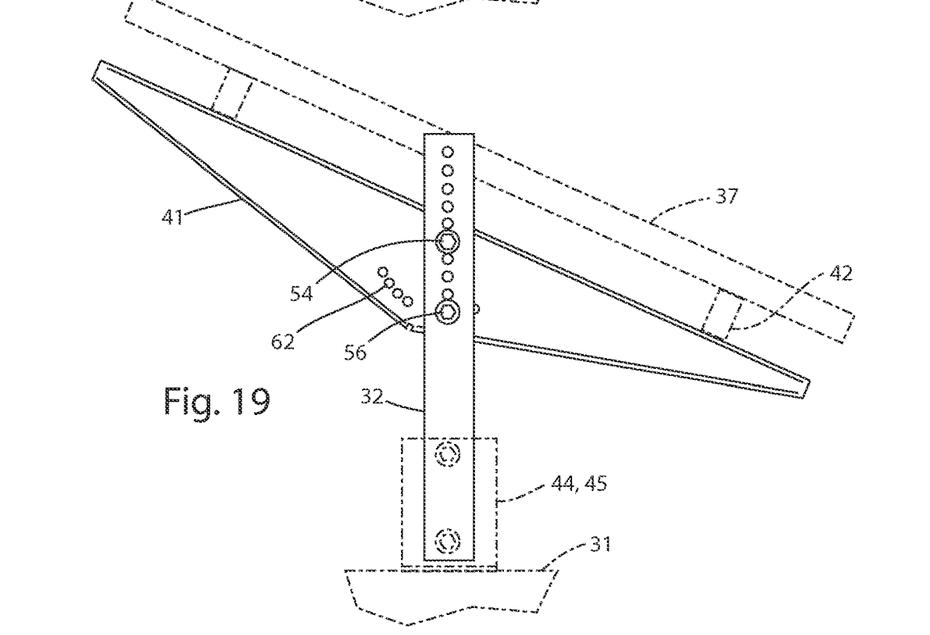

A solar panel mount system 30 (FIGS. 1-2) includes a plurality of a ballasted block support 31 resting on a ground surface 29, a post 32 pivoted to the block support 31 at a lower pivot 33, and a solar panel frame 34 pivoted to the post 32 at an upper pivot 35. The lower and upper pivots 33 and 35 locate a center of gravity (FIGS. 7-8) of the solar panel frame 34 and supported solar panels 37 generally centrally over the footprint of the ballasted block support 31, and orient the solar panel 37 facing a desired sunlight-receiving direction 38. Also, the upper pivot 35 is selectively adjusted to a desired height (see FIGS. 18-19) to maintain the solar panel 37 coplanar with other solar panels in the system 30, yet also adjusted to minimize a total height from the ground surface 29 (to minimize system torque such as from wind or ground angle or other environmental factors). The frame 34 (FIG. 2) includes a yoke 41 supported at the upper pivot 35 and support beams 42 supporting the solar panels 37.

A related method of installation includes placing the ballasted block support 31 freestanding on the ground 29, and attaching the remaining components 32, 34, 37 at desired angles to locate the center of gravity of the system (including the solar panel frame 34 and solar panel 36) over a footprint of the ballasted block support 31, and fixing an angle of the solar panel frame 34 and solar panel 36 at the desired sun-facing position. It is noted that the ballasted block supports 31 can include a feature facilitating transport, such as fork tine grooves (see support 31 on left side of FIG. 2) and/or wire loops for lift chains (see support 31 on right side of FIG. 2).

Figure 20:
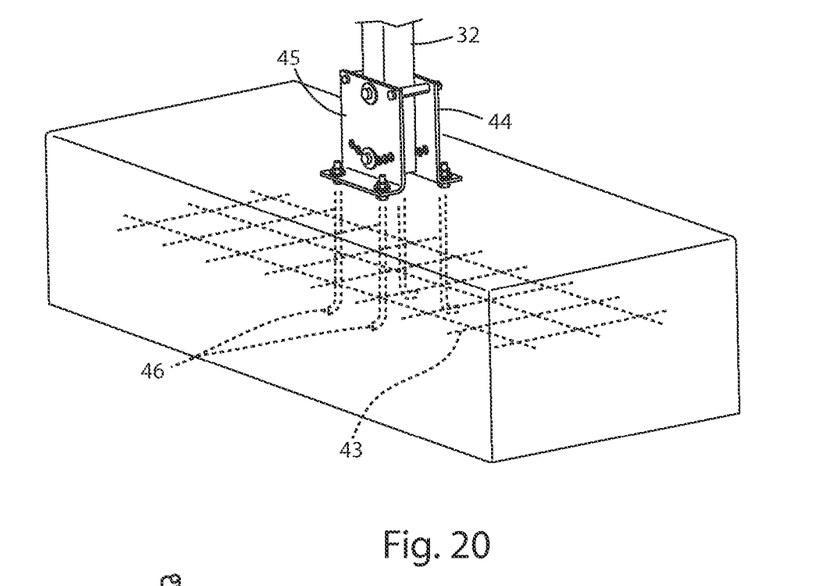
FIG. 20 is a perspective view showing a ballasted block support formed of concrete with rebar (embedded steel reinforcing bars) and with anchoring bolts having threaded upper ends exposed for attaching the anchoring brackets to fasten the posts to the ballasted block support.

The ballasted block support 31 (FIGS. 7-8) can be rested on any ground surface sufficiently stable to support the ballasted block support 31, including angled ground surfaces and/or depressions and/or ground surfaces with obstructions (such as rock or other obstacle formations). The illustrated ballasted block support 31 is made of precast reinforced concrete that forms a solid rectangle with dimensions of about 2-3 feet by about 3-5 feet and about 1.5-2 feet high and weigh about 600-3000 pounds each. However, it is contemplated that a weight and shape of the ballasted block support 31 can be engineering and designed to stably support a particular solar system, including being sufficiently stable to meet expected wind or seismic loading for a given location. Concurrently, it is contemplated that the ballasted block support 31 can be any shape, including square, rectangular, cylindrical (with curved sidewall), triangular, oval, U-shape or other desired geometric shape. The ballasted block support 31 can be moved and placed at an installation site using traditional construction equipment, and can include features to assist in lifting it, such as bottom channels (see FIG. 2, left support 31) for receiving forks of a fork truck, or U-bolt-handles (see FIG. 2, right support 31) for attaching lift chains. The illustrated ballasted block support 31 includes internal rebar 43 (FIG. 20) embedded in a concrete precast (FIG. 20). Advantageously, the concrete precast supports 31 can be made at a central facility and shipped, or cast at an installation/staging site, or cast at its final resting place.

It is contemplated that the present ballasted block support 31 can be used on stable or semi-unstable soil and ground surfaces. For example, the present ballasted block support 31 can be used on soft or moist soil and/or sand. Also, the present ballasted block support 31 could be submerged or partially submerged in shallow water, thus allowing the present system to be installed in a flood zone, an architectural pond, and/or a municipal or agricultural water/waste irrigation or treatment pond, such as where the solar panel system can be supported above the water's surface without adversely affecting (nor depending on a stability of) the underlying ground surface, but where it is not satisfactory to provide an in-the-ground support system.

Figure 21:
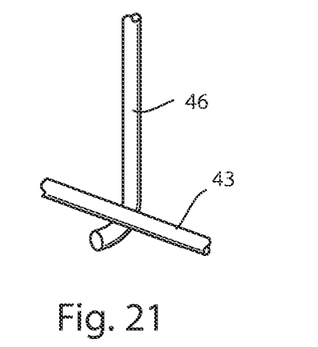
FIGS. 21-23 are perspective views of the lower end of three different anchoring bolt arrangements, FIG. 21 showing J-bolts with a hooked lower end engaging a rebar for optimal pullout strength, FIG. 22 showing J-bolts with washers on the hooked lower end (engaging or not engaging a rebar), and FIG. 23 showing a straight bolt with nut and washer on a threaded lower end where the washer engages (or does not engage) a rebar.
Figures 22, 23:
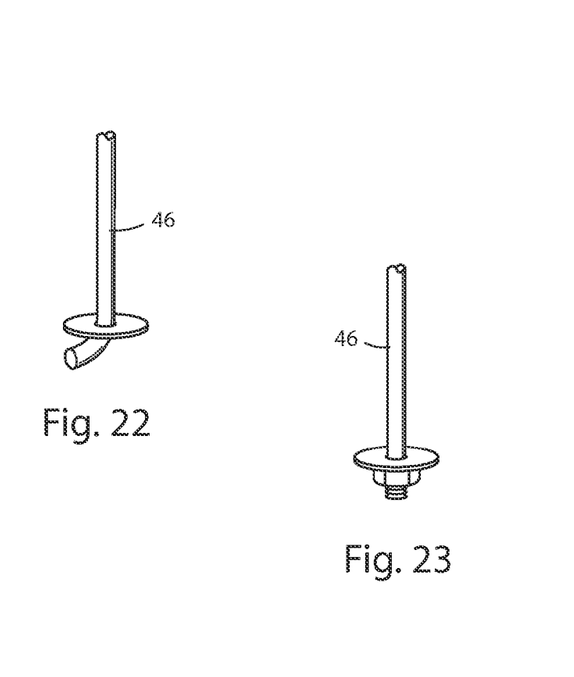

Attached to a top of the ballasted block support 31 (FIGS. 3-4) are opposing L-shaped anchor brackets 44 and 45. A lower flange of the brackets 44 and 45 includes holes receiving a threaded upper end of J-shaped anchoring bolts 46, and are fixed to the bolts 46 by nuts engaging the threaded upper ends. The J-shaped anchoring bolts 46 are cast into the precast concrete ballasted block support 31 with a lower end anchored in the cured concrete. (See FIG. 20.) This can be done in different ways, such as by using a J-bolt 46 (FIG. 21) with lower hook end anchored under rebar 43 in poured set concrete, or by using a J-bolt 46 with washer (FIG. 22) on the lower hook end again anchored under rebar 43, or by using a straight bolt with threaded lower end and washer and nut (FIG. 23) anchored under rebar 43 (or simply positioned in the concrete).

Figure 4:
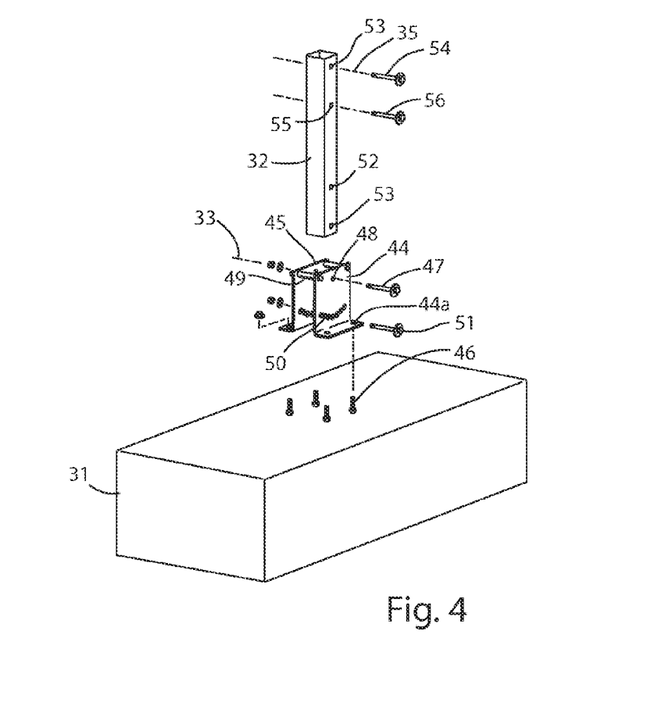
FIGS. 4-6 are enlarged perspective views of the ballasted block support, post, and yoke in FIG. 3, FIG. 4 being exploded to show individual components of the ballasted block support and also show the post.
Figures 5, 6, 7, 8, 9:
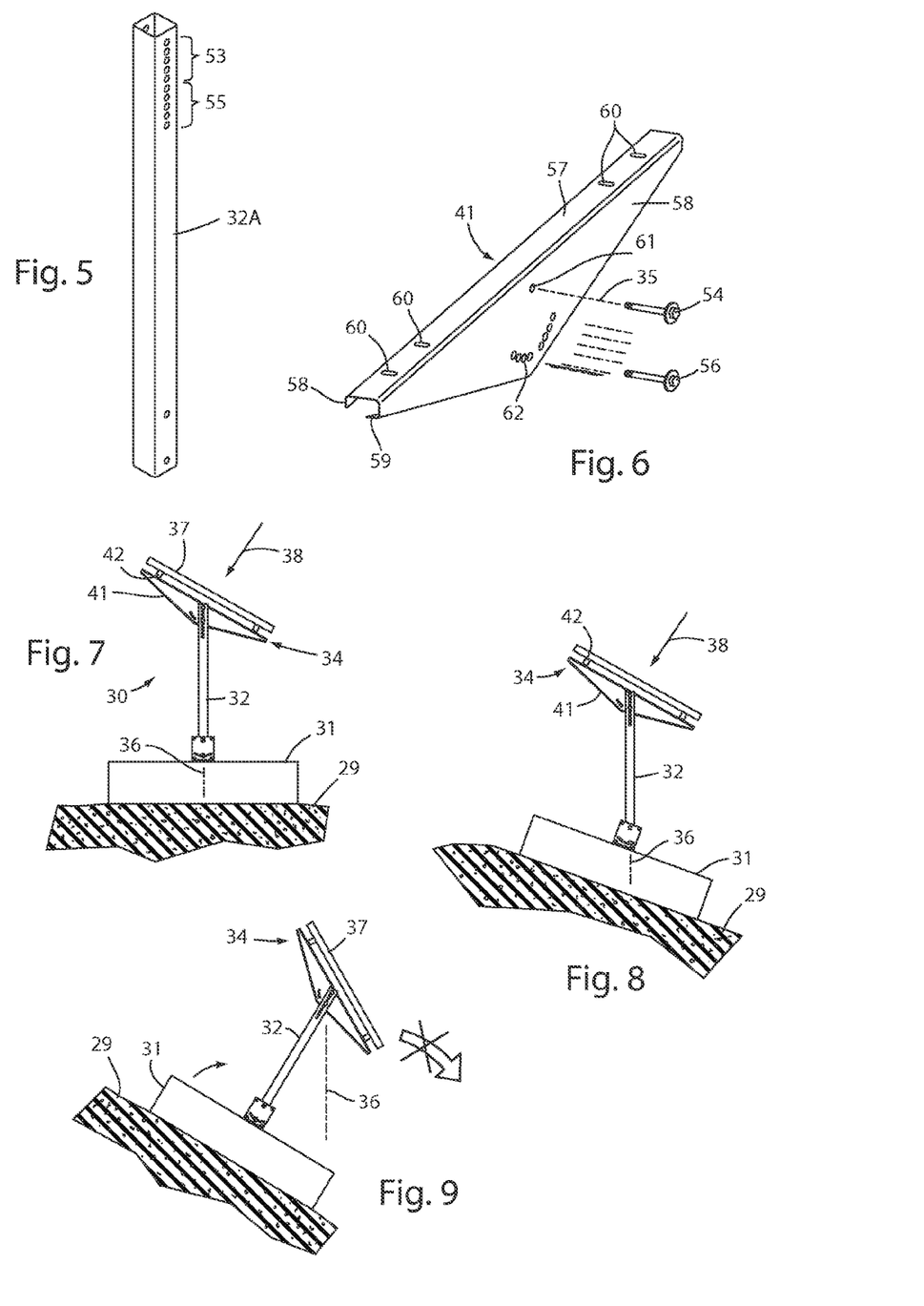
FIGS. 7-9 are side views of the apparatus adjusted to different positions, FIG. 7 showing the apparatus on flat ground surface and with the post angled so the center of gravity of the photovoltaic system is generally centered over the ballasted block support's footprint and with the photovoltaic panel angled to an optimal angle position, FIG. 8 showing the apparatus on angled ground and with the post angled so that a center of gravity of the photovoltaic system is over the ballasted block support's footprint and with the photovoltaic panel angled to an optimal sunlight-receiving position, and FIG. 9 showing the apparatus on an angled ground and with the articulated post incorrectly adjusted where the photovoltaic system would be positioned off center thus risking toppling of the system with any significant adverse wind load.
Figures 10, 11, 12:
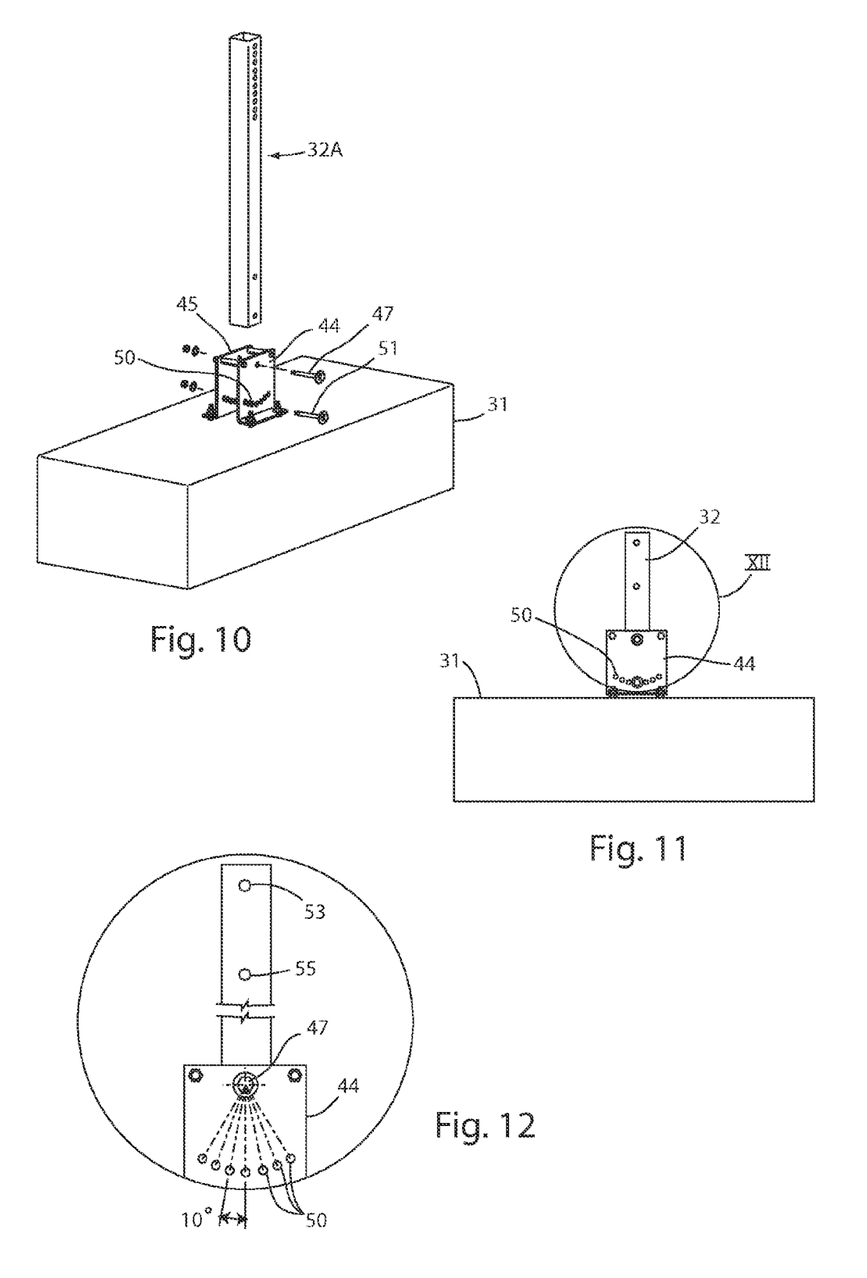
FIGS. 10-12 are perspective, side, and enlarged side views of the post and ballasted block support, including details of structure forming the lower pivot and the arcuately-positioned anchoring holes for fixing a selected angle of the post on the lower pivot.
Figure 13:
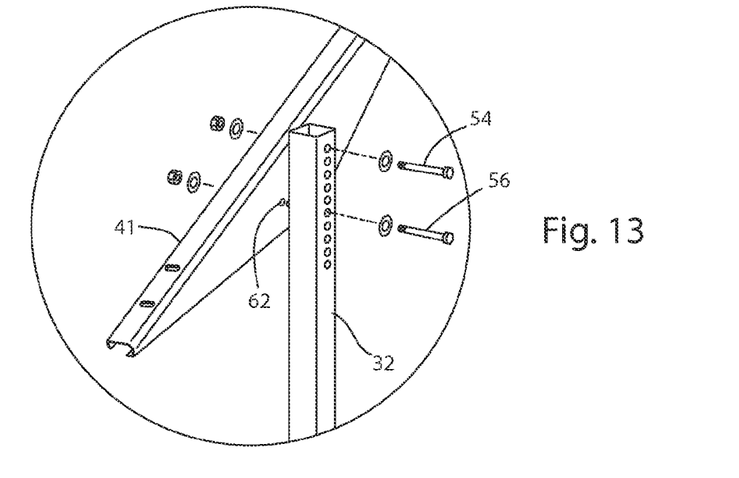
FIGS. 13-14 are perspective and side views of the post and yoke, including details of the structure forming the upper pivot and the arcuately-positioned holes for fixing a selected angle of the yoke on the upper pivot, and also showing the longitudinally-spaced holes for providing height adjustment of the yoke on the post.
Figure 14:
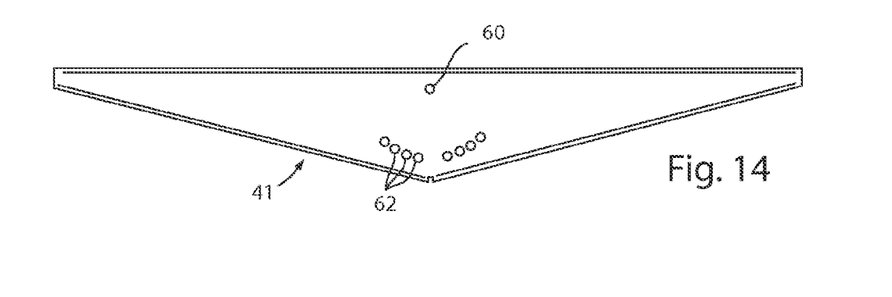
Figure 17:
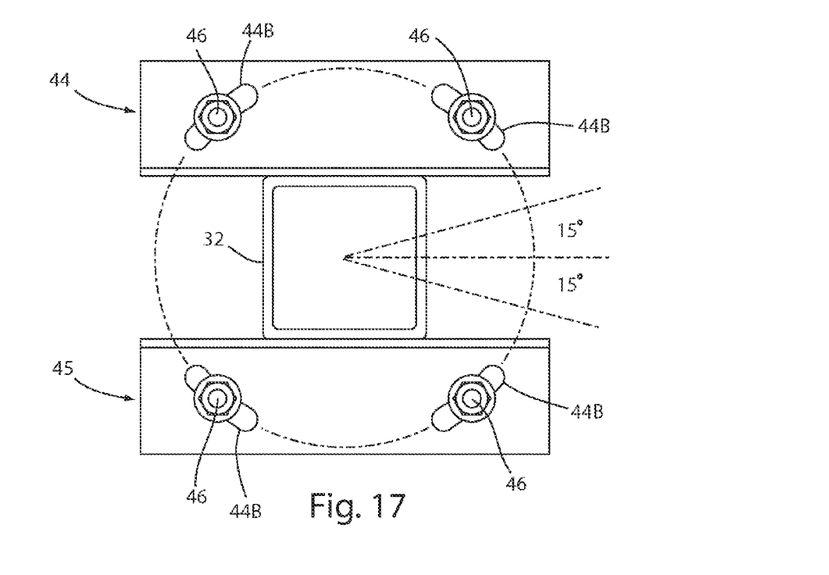
FIG. 17 is a top view of a modified anchor plate for attaching a post to a ballasted block support, including arcuate slots so that the post can be rotationally adjusted about a vertical axis on the block support up to 30 degrees angular adjustment.

Instead of holes, slots 44B (FIG. 17) can be provided in the lower flange of the brackets 44 and 45, thus providing an angular adjustability about a vertical axis. For example, slots 44B can extend about 30 degrees around the vertical axis of the post, without adversely affecting the integrity and strength of the brackets 44 and 45. A vertical flange of the brackets 44 and 45 (FIG. 4) include a top hole 48 defining the lower pivot 33. A pivot bolt 47 extends through the top hole 48 and through an aligned hole in the post 32 to define the lower pivot 33. Spacer sleeves 49 on either side of the pivot bolt 47 space the vertical flanges of brackets 44 and 45 apart, so that the post 32 is not undesirably pinched. An arcuate array of holes 50 extends around the lower pivot 33, such as every 10 degrees or so. A fixing bolt 51 is extended through the selected hole 50 and through an aligned hole in the post 32 to fix a vertical angle of the post 32. By selecting the proper hole 50, the center of gravity of the apparatus 30 including solar panel 37 can be located over the ballasted block support 31 (FIGS. 7-9).

It is to be understood that achieving a centered center of gravity (see FIGS. 7-9) is but one of one of several objectives in a given installation, particularly where an interconnected array of ballasted support blocks, posts, beams, and solar frames provide stability to each other. For example, it may also be deemed important to align all solar panels along a row of such panels in a coplanar aligned condition, where one or a limited number of the posts 32 are angled a different amount (see FIGS. 7-8 and 17) or at a different height on the support post 32 (see FIGS. 18-19) for the benefit of the system rather than for locating a center of gravity of one particular solar panel 37 exactly over its particular ballasted support bock 31.

The post 32 (FIG. 4) includes a first bottom hole 52 for receiving the pivot bolt 47 to define the lower pivot 33, a second bottom hole for receiving the fixing bolt 51 to fix an angle of the post 32, a first top hole 53 for receiving a pivot bolt 54 to define the upper pivot 35, and a second top hole 55 for receiving a fixing bolt 56 to set a selected angle of the yoke 41. A modified post 32A (FIG. 5) includes a series of vertically-spaced holes 53 and 55. By selecting a particular one of the holes 53 (compare FIGS. 18-19), a height of the upper pivot 35 can be selected that optimally suits a particular installation, yet the fixing hole can also be selected to lock in a desired post angle. For example, this can be used to level a particular solar panel 37 with adjacent solar panels in a row forming part of the overall system, despite the presence of a depression or raised area in the ground surface 29. This also can be used to accommodate installations in varying latitudes. This can be done without any need for grading or filling the depression or raised area. The illustrated posts 32 and 32A (FIGS. 4 and 5) are made of a hollow tubular steel material having a beam bending, torsional, and longitudinal strength required for a particular installation.

The solar panel frame 34 (FIG. 3) includes yokes 41 and beams 42. The yoke 41 (FIG. 6) is a transverse beam made of steel and bent to include a flat top wall 57 and triangular beam sidewalls 58 and, if desired, an in-flange 59 along a bottom edge of the sidewall(s) 58 for additional strength. Holes 60 (or slots) are formed in the top wall 57. Hole 61 is formed in the sidewalls 58 for defining the upper pivot 35, and when aligned with holes 53 in the post 32, receive the pivot bolt 54 defining the upper pivot 35. An arcuate array of holes 62 are formed around the hole 61 in each sidewall 58. The fixing bolt is extended through a selected hole 62 and through the post hole 55 to fix an angle of the yoke 41. Notably, using holes 62, a single yoke 41 can be installed at a desired angle on sides of a post 32 (FIGS. 1-3) to support one overlapped telescopingly connected end of a set of parallel support beams 42 thereon.

Figure 15:
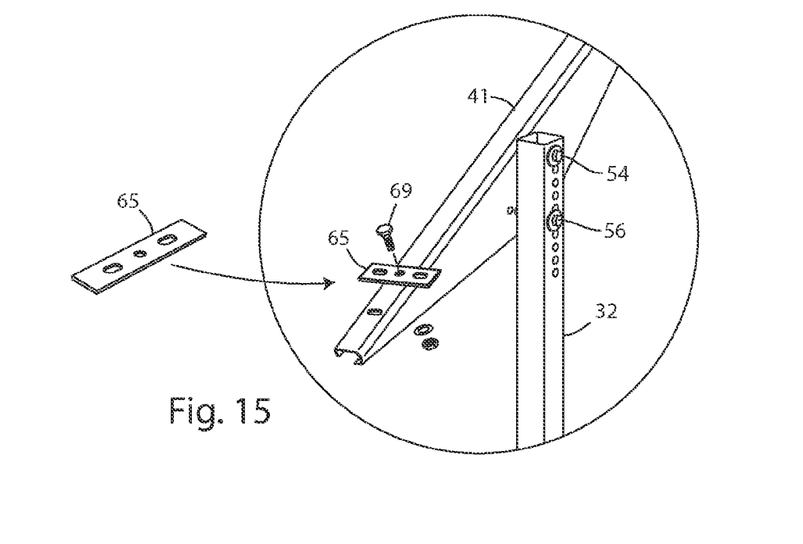
FIGS. 15-16 are perspective views showing attachment of a beam to a cross member yoke with telescopingly connected ends connected by a single bolt.
Figures 16, 16A:
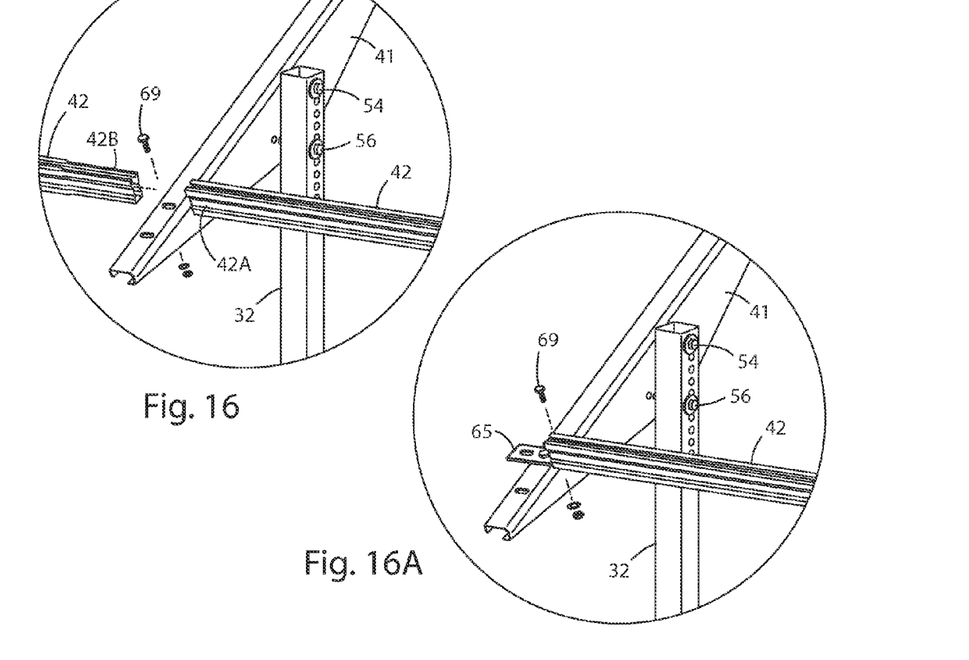
FIG. 16A is a perspective view of an alternative connection system where beams with abutting ends (i.e. ends not overlappingly telescopinglying connected) are each connected and supported by a cross bracket that secured the beams to the yoke and in abutting relationship.

Beams 42 (FIG. 3-3A) have a U-shaped cross section and are roll formed of high strength steel, such as 45 or more KSI Tensile strength, and having a thickness of 1-4 mm thickness, depending on their span and total length and overall solar system weight. The illustrated beams 42 include a flat bottom wall 64 for resting directly on the flat top wall 57 of the yoke 41, or for resting on a flat attachment bracket 65 (FIG. 15). The beams 42 (FIG. 3A) include vertical sidewalls 58 with channels 66 formed longitudinally therein for strength and include an upper curled or double-flat L-shaped flanged edges 67 also for strength. It is noted that the illustrated beams 42 include multiple bends and ribs causing the beams 42 to be surprisingly rigid and strong, despite their open section. Attachment brackets 68 can be used engage the flanged edges 67 (FIG. 3) and provide a top portion configured to engage and retain the solar panel 37 on the beams 42.

Figure 3:
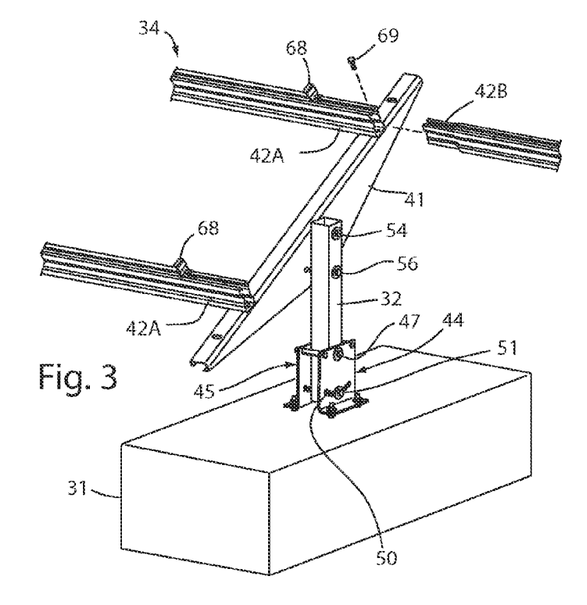
FIG. 3 is an enlarged perspective view of a post in FIG. 2.
Figure 3A:
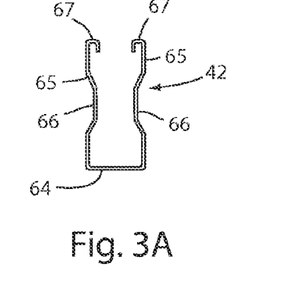
FIG. 3A is an enlarged cross section of the beam in FIG. 3.
Figure 3B:
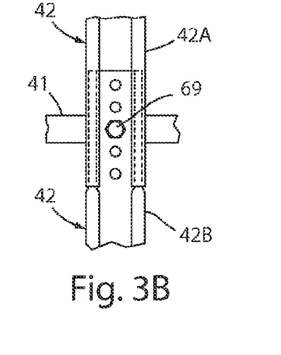
FIGS. 3B-3C are top views of the beams with overlapping telescopingly connected ends, FIG. 3, FIG. 3B showing telescopingly connected ends secured by a single vertical attachment bolt, and FIG. 3C showing an exploded view of FIG. 3B and showing a plurality of holes offering adjustable telescoping interconnection of the beams.
Figure 3C:
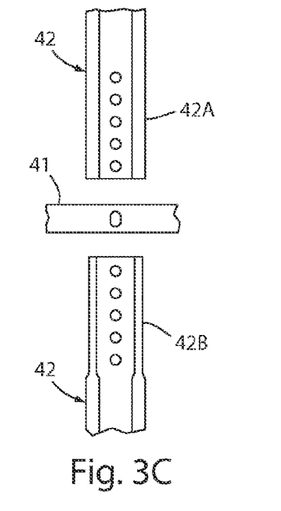

It is contemplated that the beams 42 can be bolted using a single attachment bolt 69 directly to the beam 42 (FIG. 3). The beam joint thus formed is particularly strong and stable, which is a surprising and unexpected result when using only a single attachment bolt at each connection. Notably, beams 42 are preferably made to overlappingly telescope together in a tight-fitting captured connection (FIG. 3), such that a single attachment bolt 69 can fix two aligned telescopingly-joined beams 42 to a yoke 41, thus saving cost and assembly time while still providing excellent torsional strength and stability. Notably, the beams 42 may include multiple holes or slots for the bolt 69 to pass through, thus allowing the beams 42 to be selectively telescoped together at a longitudinally adjusted position. This can be very beneficial in long runs of solar panels, since dimensional creep may require periodic longitudinal adjustments to prevent the end-to-end connected beams 42 from compressing to such an extent that they tend to blow out of co-linear alignment.

Various methods of installation are possible. One method of installation includes, (1) constructing a ballasted block support 31 with brackets 44 and 45 (on site or off site) and placing the ballasted block support 31 in a desired location (or casting the support 31 in the desired location) freestanding on the ground surface 29, (2) attaching the post 32 to anchor brackets on support 31 using the lower pivot 33, (3) fixing the lower pivot 33 for best center of gravity position by selecting a best arcuately-spaced hole 50 for anchoring fixing bolt 51, (4) attaching yoke 41 at desired height on upper pivot 35 by selecting the best upper pivot hole from the longitudinally spaced holes 53, (5) fixing an angle of the yoke and thus the horizontal tilt of the solar panel 37 by selecting a best arcuately-spaced hole 62 for best sunlight-receiving orientation of the solar panel using fixing bolt 56 through chosen holes 62 and 55, and (6) operably connecting the solar panels to form an optimized solar energy system.

The illustrated ballasted block supports are precast concrete. However, it is contemplated that the innovative ballasted block supports can be made from (or made to be filled by) any local material suitable as a heavy ballast. For example, it is contemplated that a hollow support shell (fully hollow or partially prefilled) can be constructed of any suitable material (e.g. concrete, metal, wood, plastic, composite, stone, clay, or other) and filled by suitable solid low cost fill/ballast material that is locally available (e.g. concrete, clay, stone, metal, energy storage batteries). It is contemplated that the present hollow support shell (fully hollow or partially prefilled), if made sufficiently rigid, can be made to retain non-solid heavy ballast materials (e.g. sand, debris, dirt, slurries, soil/sand mix, water, combinations of same, and/or other).

Advantageously, the present innovative system described above is able to provide self-ballasted mounting systems for solar panels with mounting footprints allowing it to replace the need for penetrative solar mounting systems (e.g. driven vertical-support posts, lag screws for roofs, augers for ground soil). Further, it provides hardware that allows for angular adjustment of generally vertical mounting posts that support a solar collector array, but does so without earth-penetrating mounting posts or poured concrete foundations. Still further, its hardware can be adapted for many different installations, such as even on rooftop situations, where it is desirable to not penetrate the roof, yet stably support the solar system at an optimal sunlight-receiving angle. Another advantage of the present system is that it has an ability to meet local codes and generally accepted engineering standards for wind-loading and/or seismic requirements for a completed installed system. Notably, the present innovative system is useful in installations on EPA-remediation sites where penetration below a capped landfill is not allowed, or on a membrane covered landfill site, or submerged in shallow water ponds or in flood zones, where penetration is not an option or is not desirable.

The present innovative system also provides a system that takes advantage of financial and tax incentives due to the nonpermanent nature of the present ballasted solar mount system. Specifically, it is noted that ballasted and nonpermanent installations can be considered accessory equipment and thus are not taxed as an "installation/capital asset" tax basis. Thus, permits from local governments can be obtained by legally describing the installation as "temporary" (as opposed to "permanent"). Thus, a permit to cover the landscape with a ballasted solar system can be permitted as a temporary structure, providing significant tax incentives and tax advantages.

The present innovative mounting system can be used in substantially any earthly location (latitude and longitude) and most soil conditions (e.g. rock, lava, sand, sub-polar tundra, polar ice). Also, the present innovative system is portable (or at least semi-portable) so it can be readily moved (or moved after subassembly). This enables powering of seasonal or temporary expeditions, geological exploration for mining, oil, and/or gas, or military requirement. For example, it is contemplated that the present innovative mount system can be used to bring electric power to storm ravaged recovery zones, refugee camps, and other disaster or war-torn geographies.

Notably, the present innovative mount system itself is capable of supporting a solar panel array(s) in a most stable gravitational position (with center of gravity over a best location), yet adjustably supports the solar panel array(s) in an optimal angular position for receiving sunlight, and also adjustably supports the solar panel array(s) of the system in a relatively coplanar condition despite undulations and disruptions in the underlying ground surface.

An advantage of the present innovative mount system is that it can be used to support solar panels which create electric power (photovoltaic panels) and/or thermal power (e.g. hot water or hot air), or hybrid combinations of both.

It is to be understood that variations and modifications can be made on the aforementioned structure without departing from the concepts of the present invention, and further it is to be understood that such concepts are intended to be covered by the following claims unless these claims by their language expressly state otherwise.

The embodiments of the invention in which an exclusive property or privilege is claimed are defined as follows:

1. A solar panel mount system, comprising:
   a ballasted block support including opposing L-shaped anchor brackets with aligned first pivot holes defining a first axis of rotation and first fixing holes spaced around the first pivot holes;
   a post pivoted to the block support at a lower pivot by a first pivot bolt extended through the post and through the aligned first pivot holes, and fixed by a first fixing bolt extended through the post and through a selected one set of the first fixing holes;
   a yoke including aligned second pivot holes defining a second axis of rotation and second fixing holes spaced around the second pivot holes, wherein the second axis of rotation is parallel to the first axis of rotation;
   the post further pivoted to the yoke at an upper pivot by a second pivot bolt extended through the post and through the aligned second pivot holes, and fixed by a second fixing bolt extended through the post and through a selected one set of the second fixing holes, wherein the first pivot bolt, the first fixing bolt, the second pivot bolt, and the second fixing bolt are parallel with one another; and
   at least one solar panel within a solar panel frame fixed to the yoke with the solar panel frame, the at least one solar panel, and the yoke having a center of gravity vertically in line with the opposing L-shaped anchor brackets, wherein the post defines an angle relative to an upper surface of the ballasted block support, based on a position of the center of gravity.

2. The solar panel mount system defined in claim 1, wherein the ballasted block support includes a flat bottom that stably engages a mating ground surface without additional anchoring to the ground surface.

3. The solar panel mount system defined in claim 1, including a second ballasted block support, second post pivoted to the block support at a second lower pivot; the solar panel frame being pivoted to the second post at a second upper pivot.

4. The solar panel mount system defined in claim 1, wherein the opposing L-shaped anchor brackets rotational adjustably engage the ballasted block support defining a third axis of rotation, wherein the third axis of rotation is perpendicular to the first axis of rotation.

5. The solar panel mount system defined in claim 4, wherein, when the opposing L-shaped anchor brackets are rotationally adjusted with respect to the ballasted block support about the third axis of rotation, the second axis of rotation remains parallel to the first axis of rotation and the third axis of rotation remains perpendicular to the first axis of rotation.

6. The solar panel mount system defined in claim 1, wherein the ballasted support block comprises a concrete block having weight of greater than 1000 pounds and footprint of greater than 2 feet×3 feet, and includes a flat bottom configured to rest on a ground surface and stably support a solar panel array without being buried into the ground surface.

7. The solar panel mount system defined in claim 1, wherein the solar panel frame includes interconnected beams supported at least on the ends of the yoke and defining an upper surface supporting the at least one solar panel.

8. The solar panel mount system defined in claim 1, wherein the post includes a series of longitudinally-spaced holes for selectively engagement by the second pivot bolt and second fixing bolt, wherein, when the second pivot bolt is engaged with a first hole of the series of longitudinally-spaced holes, a first distance from the ballasted block support to the at least one solar panel is defined, wherein, when the second pivot bolt is engaged with a second hole of the series of longitudinally-spaced holes, a second distance from the ballasted block support to the at least one solar panel is defined, and wherein the second distance is greater than the first distance.

9. A solar panel mount system for attachment above a support, the system comprising:
   a ballasted block support;
   a post pivoted to the ballasted block support at a lower pivot defining a lower axis of rotation;
   a yoke including aligned pivot holes defining an upper axis of rotation and fixing holes spaced around the pivot holes, wherein the upper axis of rotation is parallel with the lower axis of rotation;
   the post being pivoted to the yoke at the upper pivot by a pivot bolt extended through the post and through the pivot holes, and fixed by a fixing bolt extended through the post and through selected ones of the fixing holes, wherein the pivot bolt and the fixing bolt are parallel with the lower axis of rotation; and
   at least one solar panel within a solar panel frame fixed to the yoke, the solar panel frame having a center of gravity vertically in line with the ballasted block support with the post defining an angle relative to an upper surface of the ballasted block support based on a position of the center of gravity.

10. The solar panel mount system defined in claim 9 including a second ballasted block support, second post pivoted to the block support at a second lower pivot; the solar panel frame being pivoted to the second post at a second upper pivot.

11. The solar panel mount system defined in claim 9, wherein the post includes a first hole defining the lower pivot and a series of second holes around the first hole that can be selectively engaged to fix an angled position on the lower pivot.

12. The solar panel mount system defined in claim 9, wherein the lower pivot includes arcuate slots adapted to rotational adjustably engage the support defining a post axis of rotation, wherein the post axis of rotation is perpendicular to the lower axis of rotation, and wherein, when the lower pivot is rotationally adjusted with respect to the ballasted block support about the post axis of rotation, the upper axis of rotation remains parallel to the lower axis of rotation and the post axis of rotation remains perpendicular to the lower axis of rotation.

13. The solar panel mount system defined in claim 9, wherein the solar panel frame includes interconnected beams supported at least on the ends of the yoke and defining an upper surface supporting a solar panel array.

14. A solar panel mount system, comprising:
a ballasted block support including opposing anchor brackets, wherein the opposing anchor brackets include arcuate slots defining a post rotation axis, pivot holes defining a post pivot axis, and fixing holes spaced around the pivot holes, wherein the post rotation axis is perpendicular to the post pivot axis;
a post pivoted to the block support at a lower pivot by a pivot bolt extended through the post and through the pivot holes, and fixed by a fixing bolt extended through the post and through a selected one set of the fixing holes;
a yoke fixed to a top of the post at an upper pivot; and
at least one solar panel within a solar panel frame fixed to the yoke with the at least one solar panel, the solar panel frame and the yoke having a combined center of gravity vertically in line with the opposing anchor brackets with the post defining an angle relative to an upper surface of the ballasted block support based on a position of the center of gravity.

15. A solar panel mount system, comprising:
a ballasted block support with anchor brackets;
a post pivoted to the block support, about a lower pivot axis, at an angle-adjustable lower pivot defined by the anchor brackets; and
a solar panel frame pivoted to the post, about an upper pivot axis, at an angle-adjustable upper pivot and supporting a solar panel array facing toward a desired sunlight-receiving direction, wherein the upper pivot axis is parallel with the lower pivot axis;
first bolts engaging the post and the anchor brackets, and both pivotally mounting and then fixing the post to the ballasted block support at a selected upright angle to the ballasted block support; and
second bolts engaging the post and yoke, and both pivotally mounting and then fixing the yoke to the post with the solar panel frame having a center of gravity vertically in line with the anchor brackets with the post defining an angle relative to an upper surface of the ballasted block support based on a position of the center of gravity.

16. A method of adjustably mounting a solar panel array to a ballasted block support, comprising:
providing a ballasted block support including opposing L-shaped anchor brackets with aligned first pivot holes defining a first axis of rotation and first fixing holes spaced around the first pivot holes;
pivoting a post to the ballasted block support at a lower pivot by extending a first pivot bolt through the post and through the aligned first pivot holes, and fixing the post at a desired angle by extending a first fixing bolt through the post and through a selected one set of the first fixing holes;
providing a yoke including aligned second pivot holes defining a second axis of rotation and second fixing holes spaced around the second pivot holes;
pivoting the post to the yoke at an upper pivot by extending a second pivot bolt through the post and through the aligned second pivot holes, and fixing the yoke at a desired angle by extending a second fixing bolt through the post and through a selected one set of the second fixing holes, wherein the second axis of rotation remains parallel with the first axis of rotation while the post is pivoted with respect to the ballasted block support and while the post is pivoted with respect to the yoke; and
attaching a solar panel frame and solar panel array to the yoke with the solar panel frame and solar panel having a combined center of gravity vertically in line with the lower pivot with the post defining an angle relative to an upper surface of the ballasted block support based on a position of the center of gravity.

17. A method of constructing solar panel mount system comprising:
providing a ballasted block support with anchor brackets;
pivotally and rotationally attaching a post to the ballasted block support with an angle-adjustable lower pivot, wherein a post rotation axis is defined between the ballasted block support and the angled-adjustable lower pivot, wherein a first post pivot axis is defined between the post and the angle-adjustable lower pivot, and wherein, when the post is rotated about the post rotation axis, the post rotation axis remains perpendicular to the first post pivot axis;
pivotally attaching a solar panel frame to the post at an angle-adjustable upper pivot, defining a second post pivot axis, and supporting a solar panel array facing toward a desired sunlight-receiving direction, wherein the second post pivot axis is parallel with the first post pivot axis;
engaging first anchor bolts with the post and the anchor brackets to fix the post to the ballasted block support at a selected upright angle to the block support; and
engaging second anchor bolts with the post and the yoke to fix the yoke to the post at a selected sun-facing angle with the solar panel frame having a center of gravity vertically in line with the anchor brackets with the post defining an angle relative to an upper surface of the ballasted block support based on a position of the center of gravity.

* * * * *